(12) United States Patent
Yokoyama et al.

(10) Patent No.: US 11,417,530 B2
(45) Date of Patent: Aug. 16, 2022

(54) ETCHING METHOD

(71) Applicant: Tokyo Electron Limited, Tokyo (JP)

(72) Inventors: Takahiro Yokoyama, Miyagi (JP); Maju Tomura, Miyagi (JP); Yoshihide Kihara, Miyagi (JP); Ryutaro Suda, Miyagi (JP); Takatoshi Orui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/930,483

(22) Filed: Jul. 16, 2020

(65) Prior Publication Data

US 2021/0143016 A1    May 13, 2021

Related U.S. Application Data

(63) Continuation-in-part of application No. PCT/JP2020/005847, filed on Feb. 14, 2020.

(30) Foreign Application Priority Data

Nov. 8, 2019  (JP) .............................. JP2019-203326

(51) Int. Cl.
  *H01L 21/3065*    (2006.01)
  *H01L 21/02*    (2006.01)
  *H01J 37/32*    (2006.01)

(52) U.S. Cl.
  CPC .... *H01L 21/3065* (2013.01); *H01J 37/32082* (2013.01); *H01J 37/32449* (2013.01); *H01L 21/02164* (2013.01); *H01J 2237/334* (2013.01)

(58) Field of Classification Search
  CPC ........... H01J 2237/334; H01J 37/32082; H01J 37/32449; H01L 21/02164; H01L 21/31116; H01L 21/3065; H01L 21/31144; H01L 21/32137; H01L 21/32139
  USPC ....... 438/706, 710, 712, 714, 719, 723, 736, 438/750
  See application file for complete search history.

(56) References Cited

U.S. PATENT DOCUMENTS

| | | | |
|---|---|---|---|
| 4,406,733 | A | 9/1983 | Tachi |
| 4,943,344 | A | 7/1990 | Tachi et al. |
| 5,147,500 | A | 9/1992 | Tachi et al. |
| 5,643,473 | A | 7/1997 | Tachi et al. |

(Continued)

FOREIGN PATENT DOCUMENTS

| | | |
|---|---|---|
| JP | 1977-131470 A | 11/1977 |
| JP | 1988-110726 A | 5/1988 |

(Continued)

OTHER PUBLICATIONS

International Search Report and Written Opinion dated Apr. 7, 2020 for PCT/JP2020/005847 filed on Feb. 14, 2020, 14 pages.

(Continued)

*Primary Examiner* — Lan Vinh
(74) *Attorney, Agent, or Firm* — Xsensus LLP

(57) ABSTRACT

An etching method of an exemplary embodiment involves providing a substrate in a chamber of a plasma treatment system. The substrate includes a silicon-containing film. The method further involves etching the silicon-containing film by a chemical species in plasma generated from a process gas in the chamber. The process gas contains a halogen gas component and phosphorous gas component.

22 Claims, 10 Drawing Sheets

(56) References Cited

U.S. PATENT DOCUMENTS

| | | |
|---|---|---|
| 6,635,185 B2 | 10/2003 | Demmin et al. |
| 6,793,832 B1 | 9/2004 | Saito et al. |
| 7,344,975 B2 | 3/2008 | Sandhu et al. |
| 7,951,683 B1 | 5/2011 | Shanker |
| 8,440,572 B2 * | 5/2013 | Honda ................. H01J 37/3244 |
| | | 438/719 |
| 8,673,787 B2 | 3/2014 | Sandhu et al. |
| 9,793,126 B2 | 10/2017 | Dhindsa et al. |
| 10,032,681 B2 | 7/2018 | Bailey, III et al. |
| 10,453,684 B1 | 10/2019 | Zhang et al. |
| 10,741,406 B2 | 8/2020 | Oomori et al. |
| 10,861,693 B2 * | 12/2020 | Stone ................. H01L 21/68742 |
| 2003/0098288 A1 * | 5/2003 | Mori ................. H01J 37/32871 |
| | | 216/2 |
| 2006/0073706 A1 | 4/2006 | Li et al. |
| 2007/0049018 A1 | 3/2007 | Sandhu et al. |
| 2011/0070665 A1 | 3/2011 | Chen et al. |
| 2011/0312180 A1 | 12/2011 | Wang |
| 2013/0323932 A1 | 12/2013 | Guha |
| 2014/0248718 A1 | 9/2014 | Kim et al. |
| 2015/0214474 A1 * | 7/2015 | Nishimura ............. H01L 43/08 |
| | | 438/3 |
| 2015/0243521 A1 | 8/2015 | Ogawa et al. |
| 2016/0133530 A1 | 5/2016 | Sonoda et al. |
| 2016/0293609 A1 | 10/2016 | Jha et al. |
| 2016/0343580 A1 | 11/2016 | Hudson |
| 2017/0133233 A1 * | 5/2017 | Sato ................... H01L 21/3065 |
| 2017/0222139 A1 * | 8/2017 | Nishimura ............. H01L 43/12 |
| 2017/0338119 A1 | 11/2017 | Zhang et al. |
| 2018/0233356 A1 | 8/2018 | Han et al. |
| 2018/0366336 A1 | 12/2018 | Shen et al. |
| 2019/0131140 A1 | 5/2019 | Sun et al. |

FOREIGN PATENT DOCUMENTS

| | | |
|---|---|---|
| JP | 01-103837 A | 4/1989 |
| JP | 1992-032228 A | 2/1992 |
| JP | 08-181116 A | 7/1996 |
| JP | 2000-133638 A | 5/2000 |
| JP | 2007-134660 A | 5/2007 |
| JP | 2007-141918 A | 6/2007 |
| JP | 2012-227440 A | 11/2012 |
| JP | 2015-065434 A | 4/2015 |
| JP | 2016-39310 A | 3/2016 |
| JP | 2016-092342 A | 5/2016 |
| JP | 2016-197719 A | 11/2016 |
| JP | 2017-195365 A | 10/2017 |
| WO | 2014/069559 A1 | 5/2014 |
| WO | 2019/178030 A1 | 9/2019 |

OTHER PUBLICATIONS

U.S. Office Action dated Apr. 27, 2022, in corresponding U.S. Appl. No. 17/666,570.

U.S. Office Action dated May 24, 2022, in corresponding U.S. Appl. No. 17/090,991.

* cited by examiner

ETCHING METHOD

CROSS-REFERENCE TO RELATED APPLICATIONS

The present application is a bypass continuation in part application of PCT application PCT/JP2020/005847, filed Feb. 14, 2020, which claims priority to JP 2019-203326, filed Nov. 8, 2019, the entire contents of each of which being incorporated herein by reference.

TECHNICAL FIELD

Exemplary embodiments of the present disclosure relate to an etching method.

BACKGROUND ART

The production of electronic devices involves plasma etching of silicon-containing films on substrates. The plasma etching of the silicon-containing films uses process gases containing a gaseous fluorocarbon. Such plasma etching is disclosed in US Patent Application No. 2016/0343580.

SUMMARY

Technical Problems

The present disclosure describes techniques that reduce lateral etching in plasma etching processes of a silicon-containing films.

Solutions to Problems

An exemplary embodiment provides an etching method involving a step of providing a substrate in a chamber of a plasma processing apparatus. The substrate includes a silicon-containing film. The method further involves a step of etching the silicon-containing film with a chemical species generated from the process gas in the chamber. The process gas contains a halogen gas component and phosphorous gas component. Various techniques include, individually and/or in combination, controlling proportional gas flow rates, forming protective films on side walls of the etched recess, where the protective film includes phosphorus-oxygen bonds derived from the phosphorous component contained in the process gas, applying pulsed bias electric power to a bottom electrode of a substrate support in the process chamber, and controlling substrate temperature to 0° C. or less, for example.

Advantageous Effects

There are numerous advantageous effects offered by each of the techniques, whether used alone or in combination, but one advantageous effect is an ability to reduce lateral etching of the silicon-containing film in a plasma etching process.

DESCRIPTION OF EMBODIMENTS

Figure 1:
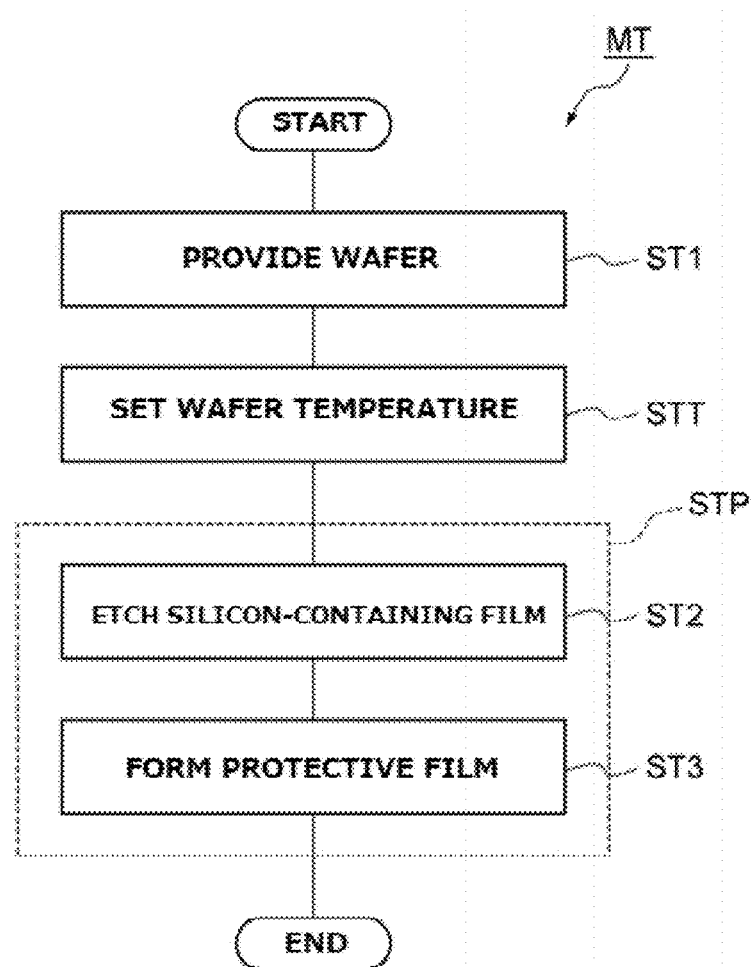
FIG. 1 is a flow chart of an etching method of an exemplary embodiment.

Various exemplary embodiments will now be described. It should be understood that although the embodiments are separately described, the description is provided in this way to facilitate the readability of the document. The techniques described in the various embodiments are complimentary, and thus it should be understood that the various embodiments may be used individually, or in combination. Thus, the each combination of the disclosed embodiments, whether taken pair-wise, or in groups of three or four, for example, are themselves separate embodiments.

An exemplary embodiment provides an etching method. The method involves a step of providing a substrate in a chamber of a plasma treatment system. The substrate includes a silicon-containing film. The method further involves a step of etching the silicon-containing film with a chemical species generated from the process gas in the chamber. The process gas contains a halogen component and a phosphorus component.

According to the embodiment described above, a protective film containing silicon and phosphorus contained in the process gas is formed on a side wall of a recess (e.g., a hole, groove, depression, or the like) in a silicon-containing film through etching. The protective film enables the side wall to be protected while the silicon-containing film is etched. Inadvertently, lateral etching can thereby be reduced during the plasma etching of the silicon-containing film.

According to an exemplary embodiment, the method may further involve a step of forming a protective film on the side wall of the recess formed in the step of etching. In this embodiment, the protective film contains phosphorus that was presented in the process gas.

As will be discussed, the step of etching and the step of forming the protective film may be carried out at the same time or different times.

The process gas may include at least one phosphorus compound selected from the group consisting of PF3, PCl3, PF5, PCl5, POCl3, PH3, PBr3, and PBr5.

Additionally, the process gas may further contain a carbon component and a hydrogen component. When referring to a "source" in this context, the meaning is that hydrogen is provided in some fashion, such as a "source of hydrogen", and thus a component of the process gas. Moreover, the hydrogen may be input to the chamber as a gas with hydrogen included as an element of the gas, or a molecular component of a larger molecule.

As an example, the process gas may contain at least one hydrogen component (or source of hydrogen) selected from the group of molecules consisting of H2, HF, CxHy, CHxFy, and NH3, where x and y are each natural numbers.

In an exemplary embodiment, the halogen gas may be a fluorine component.

In an exemplary embodiment, the process gas may further contain oxygen.

In an exemplary embodiment, the silicon-containing film may be a dielectric silicon-containing film.

In an exemplary embodiment, the silicon-containing film may include at least one film selected from the group consisting of a silicon oxide film, silicon nitride film, and a silicon film.

In an exemplary embodiment, the silicon-containing film may include at least two different silicon-containing sublayers. In this context, a "sublayer" may be construed as a layer or film.

In an exemplary embodiment, the at least two different silicon-containing sublayers include a silicon oxide sublayer and a silicon nitride sublayer. Alternatively, at least two silicon-containing sublayers include a silicon oxide sublayer and a silicon sublayer. Alternatively, the at least two silicon-containing sublayers include a silicon oxide sublayer, a silicon nitride sublayer, and a silicon sublayer.

In an exemplary embodiment, the substrate may further include a mask disposed on the silicon-containing film.

As will be discussed, the temperature of the substrate may be set to a temperature of 0° C. or less prior to beginning of etching.

Another exemplary embodiment provides a plasma treatment system. The plasma treatment system includes a chamber, a substrate support, a gas supply unit, and a radio-frequency power source. The substrate support is configured to support the substrate in the chamber. The gas supply unit is configured to supply a process gas for etching a silicon-containing film in the chamber. The process gas contains a halogen gas component and phosphorous gas component. The radio-frequency power source is configured to generate radio-frequency power for generating plasma from the process gas in the chamber.

More detailed aspects of the exemplary embodiments will now be described in greater detail in reference to the accompanying drawings. In the drawings, the same reference numeral or symbol is assigned to the same or similar components.

FIG. 1 is a flow chart of an etching method according to an exemplary embodiment. The method (hereinafter, method MT) shown in FIG. 1 is applied to a substrate having a silicon-containing film. The method MT etches the silicon-containing film. In step ST1, a substrate W is provided in a process chamber, as will be discussed with reference to FIG. 3. The process proceeds to step STT, where a temperature of the substrate W is set. In a non-limiting example, the temperature of the substrate is set to 0 degrees Celsius or colder. The process then proceeds to step STP, which includes sub-steps ST2 and ST3, which may be performed together or independently. In ST2 a silicon-containing film of the substrate W is etched, and in ST3 a protective film (or layer) is formed on a side wall of the etched recess to help avoid unwanted lateral etching of the side wall.

Figure 2:
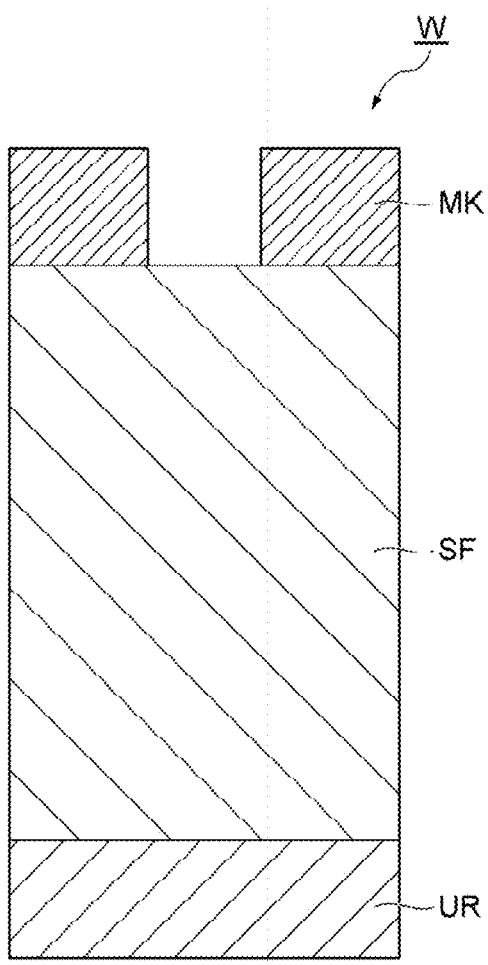
FIG. 2 is a partially enlarged cross-sectional view of an exemplary substrate to which the methods described herein, and as shown in FIG. 1 can be applied.

FIG. 2 is a partially enlarged cross-sectional view of an exemplary substrate W to which the method shown in FIG. 1 can be applied. The substrate W shown in FIG. 2 can be used in production of devices, such as DRAMs and 3D-NANDs. The substrate W has a silicon-containing film SF. The substrate W may further have an underlying region UR. The silicon-containing film SF may be disposed on the underlying region UR. The silicon-containing film SF may be a silicon-containing dielectric film. The silicon-containing dielectric film may include a silicon oxide film or a silicon nitride film. The silicon-containing dielectric film may be of any other form that contains silicon. The silicon-containing film SF may be a silicon film (for example, a polycrystalline silicon film). The silicon-containing film SF may include at least two silicon containing sublayers having different compositions. The at least two silicon-containing sublayers may include a silicon oxide sublayer and a silicon nitride sublayer. The silicon-containing film SF may have a multilayer configuration including alternately stacked one or more silicon oxide sublayers and one or more silicon nitride sublayers. The silicon-containing film SF may have a multilayer configuration including alternately stacked silicon oxide sublayers and silicon nitride sublayers. Alternatively, the at least two silicon-containing sublayers may include a silicon oxide sublayer and a silicon sublayer. The silicon-containing film SF may have a multilayer configuration including, for example, alternately stacked one or more silicon oxide sublayers and one or more silicon sublayers. The silicon-containing film SF may have a multilayer configuration including alternately stacked silicon oxide sublayers and polysilicon sublayers. Alternatively, the at least two silicon-containing films may include a silicon oxide sublayer, a silicon nitride sublayer, and a silicon sublayer.

The substrate W may further include a mask MK. The mask MK is disposed on the silicon-containing film SF, and is formed with a material having an etching rate that is lower than that of the silicon-containing film SF in Step ST2. The mask MK may be formed with an organic material. The mask MK may be formed from, for example, an amorphous carbon film, a photoresist film, or a spin-on-carbon film (SOC film). Alternatively, the mask MK may be a metal-containing mask formed with a metal-containing material, such as titanium nitride, metal tungsten, or tungsten carbide. The mask MK may have a thickness of 3 μm or more.

The mask MK is patterned. Moreover, the mask MK has a pattern to be transferred onto the silicon-containing film SF in Step ST2. After the pattern of the mask MK is transferred onto the silicon-containing film SF, the silicon-containing film SF may have a structure such as a recess, like a hole or trench. The aspect ratio of the structure formed on the silicon-containing film SF in Step ST2 may be 20 or more, 30 or more, 40 or more, or 50 or more. Example structures include recesses, such as holes, depressions, openings, grooves, etc.

Figure 3:
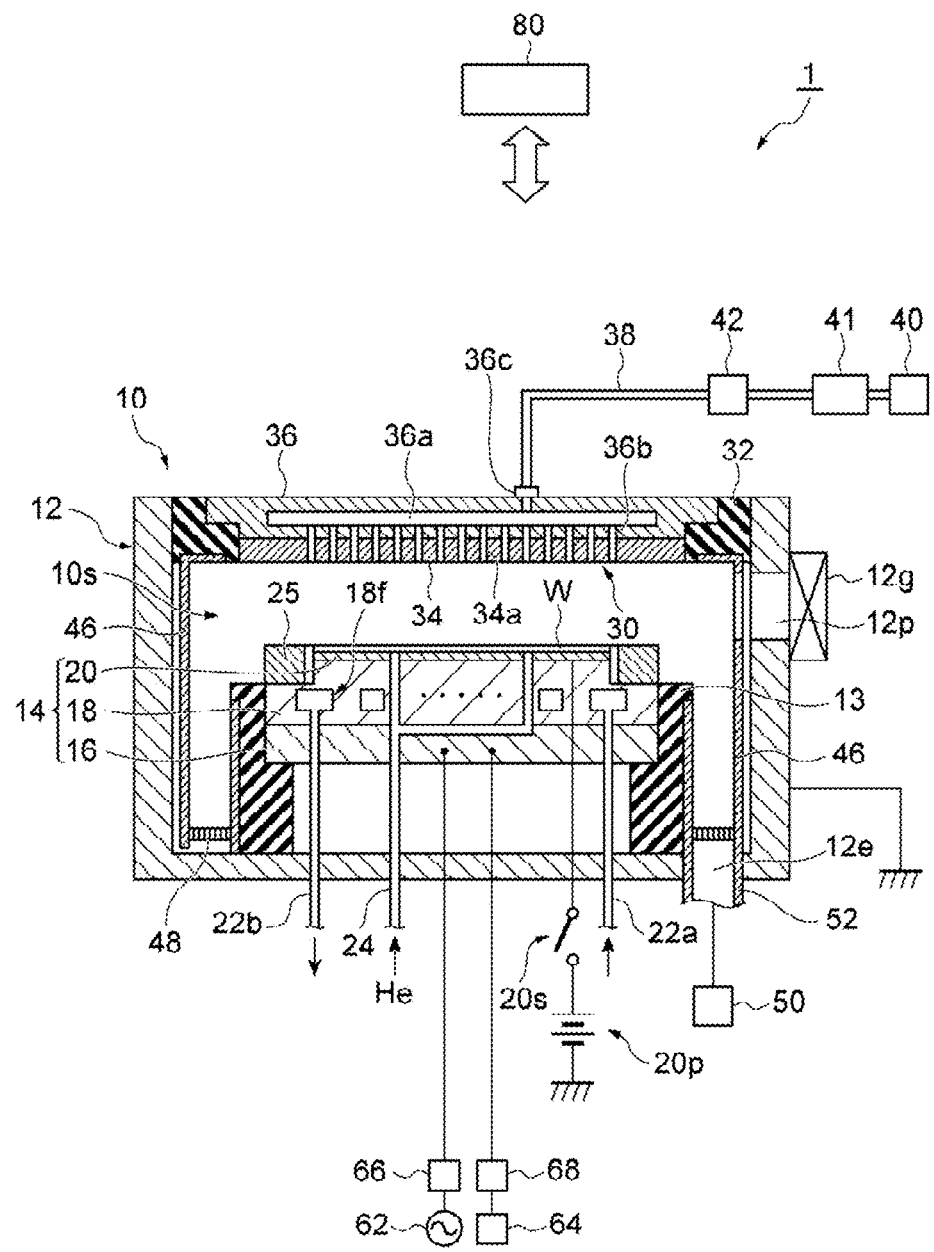
FIG. 3 is a schematic view of a plasma treatment system according to an exemplary embodiment.

In the method MT, a plasma treatment system is used for etching of the silicon-containing film SF. FIG. 3 is a schematic diagram of the plasma treatment system according to an exemplary embodiment. The plasma treatment system 1 shown in FIG. 3 includes a chamber 10 that has an internal space 10s. The chamber 10 includes a chamber body 12 that has a substantially cylindrical shape. The chamber body 12 is composed of, for example, aluminum. The chamber body 12 has an inner wall having an anticorrosive film that is composed of a ceramic substance, such as aluminum oxide or yttrium oxide.

The side wall of the chamber body 12 has a passageway 12p. The substrate W is delivered between the internal space 10s and the exterior of the chamber 10 through the passageway 12p. The passageway 12p is opened or closed by a gate valve 12g. The gate valve 12g is disposed along a side wall of the chamber body 12.

A support 13 is disposed on the bottom face of the chamber body 12. The support 13 is composed of an insulating material. The support 13 has a substantially cylindrical shape. The support 13 extends vertically from the bottom face of the chamber body 12 in the internal space 10s. The support 13 bears a substrate support 14. The substrate support 14 is configured to support the substrate W in the internal space 10s.

The substrate support 14 includes a lower electrode 18 and an electrostatic chuck 20. The substrate support 14 may further include an electrode plate 16. The electrode plate 16 is composed of a conductor such as aluminum and has a substantially discoid shape. The bottom electrode 18 is disposed on the electrode plate 16. The bottom electrode 18 is composed of a conductor, such as aluminum, and has a substantially discoid shape. The bottom electrode 18 is electrically connected to the electrode plate 16.

The electrostatic chuck 20 is disposed on the lower electrode 18. The substrate W is disposed on the electrostatic chuck 20. The electrostatic chuck 20 has a body and an electrode. The body of the electrostatic chuck 20 has a substantially discoid shape and is composed of a dielectric material. The electrode in the electrostatic chuck 20 is a film-like electrode disposed in the body of the electrostatic chuck 20. The electrode in the electrostatic chuck 20 is connected to a DC power source 20p via a switch 20s. When a voltage from the DC power source 20p is applied to the electrode of the electrostatic chuck 20, an electrostatic attractive force occurs between the electrostatic chuck 20 and the substrate W. The electrostatic chuck 20 attracts the substrate W by the electrostatic attractive force and fixes the substrate W thereon.

An edge ring 25 is disposed on the substrate support 14. The edge ring 25 may be composed of silicon, silicon carbide, or quartz. The substrate W is disposed on the electrostatic chuck 20 and is positioned in a region surrounded by the edge ring 25.

The bottom electrode 18 has a flow channel 18f therein. The flow channel 18f is supplied with a heat exchange medium (for example refrigerant) through piping 22a from a chiller disposed outside the chamber 10. The heat exchange medium supplied to the flow channel 18f returns to the chiller through piping 22b. In the plasma treatment system 1, the temperature of the substrate W on the electrostatic chuck 20 is controlled by heat exchange between the heat exchange medium and the bottom electrode 18.

The plasma treatment system 1 includes a gas supply line 24. The gas supply line 24 supplies a gap between the upper face of the electrostatic chuck 20 and the rear face of the substrate W with a heat-transfer gas (for example He gas) from a heat-transfer gas supplying mechanism.

The plasma treatment system 1 further include a top electrode 30. The top electrode 30 is disposed above the substrate support 14. The upper electrode 30 is supported at the top portion of the chamber body 12 with a member 32. The member 32 is composed of an insulating material. The upper electrode 30 and the member 32 close the upper opening of the chamber body 12.

The top electrode 30 may include a top plate 34 and a support 36. The lower surface of the top plate 34 faces the internal space 10s and defines the internal space 10s. The top plate 34 may be composed of a conductor or semiconductor that has low resistance to generate less joule heat. The top plate 34 has gas outlet holes 34a extending through the thickness.

The support 36 detachably supports the top plate 34. The support 36 is composed of a conductive material such as aluminum. The support 36 has an internal gas diffusion space 36a. The support 36 has gas holes 36b extending downward from the gas diffusion space 36a. These gas holes 36b are in communication with the respective gas outlet holes 34a. The support 36 has a gas inlet port 36c. The gas inlet port 36c is connected to the gas diffusion space 36a. The gas inlet port 36c is also connected to the gas feed pipe 38.

A group of gas sources 40 is connected to the gas feed pipe 38 through a group of flow rate controllers 41 and a group of valves 42. The group of flow rate controllers 41 and the group of valves 42 make up a gas supply unit. The gas supply unit may further include the group of gas sources 40, where it should be understood that the group of gas sources 40 includes separate gas sources. The gas sources include process gas sources used in the method MT. The group of flow rate controllers 41 includes flow rate controllers. Each of the flow rate controllers is a mass flow controller or a pressure control type flow controller. The group of valves 42 includes open-close valves. Each of the gas sources 40 is connected to the gas feed pipe 38 through the corresponding flow rate controller 41 and the corresponding open-close valve 42. The flow rate controllers 41 are controllable with a microcontroller, processor, computer or other circuitry that is either configured by software and/or hardwired to permit adjustable control over flowrates of gases from respective of the gas sources 40.

In the plasma treatment system 1, a detachable shield 46 is disposed on the face of the inner wall of the chamber body 12 and the periphery of the support 13. The shield 46 can prevent deposition of reaction byproducts in the chamber body 12. The shield 46 is formed, for example, by providing an anticorrosive film on the aluminum base. The anticorrosive film may be composed of a ceramic material, such as yttrium oxide.

A baffle plate 48 is disposed between the support 13 and the side wall of the chamber body 12. The baffle plate 48 is composed of, for example, an aluminum material provided with an anticorrosive film (e.g., yttrium oxide film). The baffle plate 48 has multiple through holes. A gas outlet port 12e is provided below the baffle plate 48 at the bottom of the chamber body 12. The gas outlet port 12e is connected to an evacuation system 50 through a gas outlet pipe 52. The evacuation system 50 includes a pressure regulating valve and a vacuum pump such as a turbo-molecular pump.

The plasma treatment system 1 includes a radio-frequency power source 62 and a bias power source 64. The radio-frequency power source 62 generates radio-frequency power HF. The radio-frequency power HF has a first frequency suitable for generation of plasma. The first frequency ranges, for example, from 27 MHz through 100 MHz. The radio-frequency power source 62 is electrically coupled to the bottom electrode 18 via a matching unit 66 and the electrode plate 16. The matching unit 66 has a matching circuit that matches the output impedance of the radio-frequency power source 62 and the impedance at the load (at the bottom electrode 18). It should be noted that the radio-frequency power source 62 may also be electrically connected to the top electrode 30 via the matching unit 66. The radio-frequency power source 62 functions as a part of an exemplary plasma generator.

The bias power source 64 generates electric power that serves a biasing function in the plasma treatment system 1. The bias power source 64 is electrically coupled to the bottom electrode 18. The bias electric power has a second frequency that is lower than the first frequency. For example, the second frequency ranges from 400 kHz through 13.56 MHz. In the case that bias electric power is used with radio-frequency power HF, the bias electric power is applied to the bottom electrode 18 so that ions are attracted to the substrate W. Upon application of the bias electric power to the bottom electrode 18, the potential of the substrate W disposed on the substrate support 14 varies in response to each period of the second frequency.

In one embodiment, the bias electric power may be radio-frequency power LF having a second frequency. In the case that the radio-frequency power LF is used with the radio-frequency power HF, radio-frequency power LF is used as radio-frequency bias power that allows the substrate W to attract ions. The bias power source 64, which can generate radio-frequency power LF, is coupled to the bottom electrode 18 via a matching unit 68 and the electrode plate 16. The matching unit 68 has a circuit for matching of the output impedance of the bias power source 64 and the impedance at the load (at the bottom electrode 18).

The plasma may be generated using only the radio-frequency power LF (without use of the radio-frequency power HF), in other words using single radio-frequency power. In such a case, the radio-frequency power LF may have a frequency higher than 13.56 MHz, for example, 40 MHz. In such a case, the plasma treatment system 1 may not require the radio-frequency power source 62 or the matching unit 66. In such a case, the bias power source 64 makes up an exemplary plasma generator.

In another embodiment, the bias electric power may be a pulsed DC voltage with negative polarity. The pulsed DC voltage with negative polarity is periodically generated and applied to the bottom electrode 18. A period of the pulsed DC voltage with negative polarity is defined by the second frequency. The period of the pulsed DC voltage with negative polarity includes two terms, where each term corresponds to time frame at which the voltage is applied at a different predetermined level. The level (or absolute value) of the pulsed DC voltage with negative polarity at one of the two terms is higher than the level (or absolute value) of the pulsed DC voltage with negative polarity at the other term. The level of the pulsed DC voltage with negative polarity at the other term may be higher than zero or be zero. In this embodiment, the bias power source 64 is connected to the bottom electrode 18 via a low-pass filter and the electrode plate 16.

In one embodiment, the bias power source 64 may continuously apply the bias electric power to the bottom electrode 18. Moreover, the bias power source 64 may continuously apply bias electric power to the bottom electrode 18. Uninterrupted application of the bias electric power may be applied to the bottom electrode 18 during Step STP, i.e., Steps ST2 and ST3 in the method MT.

In another embodiment, the bias power source 64 may apply pulsed bias electric power to the bottom electrode 18. The pulsed bias electric power may be applied to the bottom electrode 18 at a third frequency, or repetition rate. The third frequency is lower than the second frequency, such as, for example, in an inclusive range from 5 Hz or more through 100 kHz or less. In this context the application of the pulsed bias electric power may be viewed as a bi-level waveform with each cycle having either a high or low voltage level.

The period of the pulsed waves of the bias electric power includes two terms, i.e., a term "H" and a term "L". The level of the bias electric power at term H is higher than the level of the bias electric power at the term L. A variation in level of the bias electric power allows the pulsed bias electric power to be applied to the bottom electrode 18. The power level of the bias electric power at the term L may be higher than zero. It should be noted that the terms H and L may be an average level during the term. For example, rather than a fixed value for a particular H term, the applied power level may be shaped during the term to have one of a variety of shapes such as a ramped-up/down, triangle shape, Gaussian pulse shape and the like. Alternatively, the level of the bias electric power at the term L may be zero. In summary, supply of the pulsed bias electric power to be applied to the bottom electrode 18 is alternately switched between continuation and cessation (e.g., ON/OFF). If the bias electric power is radio-frequency power LF, the level of the bias electric power is the level of the radio-frequency power LF. If the bias electric power is pulsed DC voltage with negative polarity, the effective level of the bias electric power corresponds to the absolute DC voltage with a negative polarity. The duty ratio of the pulsed bias electric power (i.e., the time where power is applied relative to a total period of time for a cycle) may be controlled within a range. Moreover, the length of the term H to the total period of the pulsed bias electric power is, for example, in an inclusive range of 1% or more through 80% or less. The pulsed bias electric power may be applied to the bottom electrode 18 in Steps ST2 and ST3 in the method MT.

In one embodiment, the radio-frequency power source 62 may supply continuous waves of the radio-frequency power HF. In other words, the radio-frequency power source 62 may continuously supply the radio-frequency power HF. The continuous waves of the radio-frequency power HF can be supplied during Step STP, i.e., Steps ST2 and Step ST3 in the method MT.

In another embodiment, the radio-frequency power source 62 may supply pulsed waves of the radio-frequency power HF (such as Amplitude shift keying, or on/off keying). The pulsed waves of the radio-frequency power HF can be periodically supplied. The pulsed radio-frequency power HF is defined by a fourth frequency. The fourth frequency is lower than the second frequency. In one embodiment, the fourth frequency equals the third frequency. The period of the pulsed waves of the radio-frequency power HF includes two terms, a term H and a term L. The level of the radio-frequency power HF at the term H is higher than the level of the radio-frequency power HF at the term L of the two terms. The level of the radio-frequency power HF at the term L may be higher than zero or be zero.

The period of the pulsed radio-frequency power HF may be in synchronization with the period of the pulsed bias electric power. In detail, the term H in the period of the pulsed radio-frequency power HF may be in synchronization with the term H in the period of the pulsed bias electric power. Alternatively, the term H in the period of the pulsed radio-frequency power HF may not be in synchronization with the term H in the period of the pulsed bias electric power. The length of the term H in the period of the pulsed radio-frequency power HF may be the same as or different from the length of the term H in the period of the pulsed bias electric power. For clarity, within a given time frame the HF power may be applied a higher level than a different time frame for which the HF power is applied a lower level.

Modulation of the bias power levels may be synchronized, or not, with the change in power levels of the HF power.

At the start of the plasma treatment in the plasma treatment system 1, gas is supplied from the gas supply unit to the internal space 10s. The radio-frequency power HF and/or radio-frequency power LF is also supplied to generate a radio-frequency electric field between the top electrode 30 and the bottom electrode 18. The radio-frequency electric field generates plasma from the gas in the internal space 10s.

The plasma treatment system 1 further includes a controller 80. The controller 80 may be implemented as the control circuitry 130, discussed later in reference to FIG. 11. The controller 80 may be a computer provided with, for example, a processor, a storage such as a memory, an input system, a display, and a signal I/O interface. The controller 80 is configured by software to perform the control functions described herein. In one embodiment the controller 80 is an ASIC that performs the control function, or a hybrid controller that includes both a programmable controller, and an ASIC. In this embodiment, the controller 80 is a programmable computer that is configured by software to control individual components of the plasma treatment system 1. The controller 80 allows an operator to input commands to control the plasma treatment system 1 through an input device such as a keyboard, touch panel, or the like. The controller 80 allows a display to present the operational state of the plasma treatment system 1 visually. The storage stores control programs and recipe data. The processor executes the control programs to execute various processes with the plasma treatment system 1, and controls individual components in the plasma treatment system 1 in accordance with recipes.

Referring again to FIG. 1, the substrate W shown in FIG. 2 is treated in the plasma treatment system 1 in accordance with the method MT. The method MT is carried out through control of individual components by the controller 80 in the plasma treatment system 1. The following description also includes the control of individual components in the plasma processing system 1 by the controller 80 in the method MT.

The following description is carried out with reference to FIGS. 1, 4(*a*), 4(*b*), and 5. FIG. 4(*a*) is a partially enlarged cross-sectional view of an exemplary substrate to which the method shown in FIG. 1 is applied; and FIG. 4(*b*) is a partially enlarged cross-sectional view of an exemplary substrate that is etched in plasma generated from a phosphorus-free process gas. FIG. 5 is an exemplary timing chart in the method according to an exemplary embodiment where the horizontal axis indicates time while the vertical axis indicates the level of the radio-frequency power HF, the level of the bias electric power, and the supply of the process gas. The level "L" in the radio-frequency power HF indicates that no radio-frequency power HF is supplied or the level of the radio-frequency power HF is lower than the level "H". The level "L" in the bias electric power indicates that no bias electric power is applied to the bottom electrode 18 or the level of the bias electric power is lower than the level "H". The symbol "ON" in the supply of the process gas indicates that the process gas is being supplied into the chamber 10 whereas the symbol "OFF" indicates that the process gas is not being supplied into the chamber 10.

With reference to FIG. 1, the method MT starts with Step ST1. The substrate W is disposed in the chamber 10 in Step ST1. The substrate W is held on the electrostatic chuck 20 in the chamber 10.

Step STP is then performed in the method MT. Step STP involves a plasma treatment of the substrate W. Plasma is generated from the process gas in the chamber 10 in Step STP. The method MT includes Step ST2. Step ST2 is carried out in Step STP. The method MT may further include Step ST3. Step ST3 may be carried out in Step STP. Step ST2 and Step ST3 may be carried out at the same time or independently.

In Step ST2, the silicon-containing film SF is etched by a chemical species in plasma generated from the process gas in the chamber 10 in Step STP. In Step ST3, a protective film PF is formed on a substrate W by a chemical species generated from the process gas in the chamber 10 in Step STP. The protective film PF is formed on the side wall of a recess formed in the silicon-containing film SF.

The process gas used in Step STP contains a halogen component and a phosphorus component. The halogen component contained in the process gas may be fluorine. The process gas may contain at least one halogen-containing molecule such as a fluorocarbon and/or hydrofluorocarbon. Examples of the fluorocarbon include CF4, C3F8, C4F6, and C4F8. Examples of the hydrofluorocarbon includes CH2F2, CHF3, and CH3F. These fluorocarbons and hydrofluorocarbons may be used alone or in combination.

The process gas may contain at least one phosphorus compound. The phosphorus compounds may be phosphorus oxides, such as tetraphosphorus decaoxide (P4O10), tetraphosphorus octoxide (P4O8), and tetraphosphorus hexaoxide (P4O6). Tetraphosphorus decaoxide is also called diphosphorus pentoxide (P2O5). The phosphorus compounds may be phosphorus halides, such as phosphorus trifluoride (PF3), phosphorus pentafluoride (PF5), phosphorus trichloride (PCl3), phosphorus pentachloride (PCl5), phosphorous tribromide (PBr3), phosphorus pentabromide (PBr5), and phosphorus triiodide (PI3). The phosphorus compound may be phosphoryl halides, such as phosphoryl fluoride (POF3), phosphorus oxychloride (POCl3), and phosphoryl bromide (POBr3). The phosphorus compounds may be phosphine (PH3), calcium phosphide (Ca3P2), phosphoric acid (H3PO4), sodium phosphate (Na3PO4), and hexafluorophosphoric acid (HPF6). The at least one phosphorus component in the process gas may be at least one of these phosphorus compounds. For example, the process gas may contain at least one phosphorus compound selected from the group consisting of PF3, PCl3, PF5, PCl5, POCl3, PH3, PBr3, and PBr5. A solid or liquid phosphorus compound may be heated to vaporization and then introduced in the chamber 10.

The process gas used in Step STP may further contain a carbon source and a hydrogen source. Examples of the hydrogen component in the process gas include H2, hydrogen fluoride (HF), hydrocarbons (CxHy), hydrofluorocarbons (CHxFy), and NH3 where x and y are each an natural number. These gases may be used alone or in combination. Examples of the hydrocarbon include CH4 and C3H6. Examples of the carbon component in the process gas include fluorocarbons and/or hydrocarbons (for example CH4). The process gas may further contain oxygen. For example, the process gas may contain O2. Alternatively, the process gas may be free of oxygen.

In one embodiment, the process gas may contain a first gas and a second gas. The first gas does not contain phosphorus, and may contain a halogen component. The first gas may contain gas of at least one of the halogen-containing molecule described above. The first gas may further contain a carbon component and a hydrogen component. The first gas may further contain gas of a hydrogen-containing molecule and/or gas of a carbon-containing molecule. The first gas may further contain oxygen. The first gas may contain O2 gas. Alternatively, the first gas may be free of oxygen.

The second gas is a gas containing phosphorus. The second gas may contain gas of the at least one of the phosphorus compounds described above.

In the process gas used in Step STP, the ratio of the flow rate of the second gas to the flow rate of the first gas may be above 0 and 0.5 or less. The ratio may be 0.075 or more and 0.3 or less. The ratio may be 0.1 or more and 0.25 or less.

With reference to FIG. 5, the process gas is supplied to the chamber 10 in Step STP. In Step STP, the gas pressure in the chamber 10 is adjusted to a predetermined value. In Step STP, the gas pressure in the chamber 10 may be adjusted to 10 mTorr (1.3 Pa) or more and 100 mTorr (13.3 Pa) or less. In Step STP, a radio-frequency power HF is supplied to form plasma from the process gas in the chamber 10. As depicted with a solid line in FIG. 5, a continuous wave of radio-frequency power HF may be applied in Step STP. In Step STP, the radio-frequency power HF may be replaced with the radio-frequency power LF. In Step STP, both the radio-frequency power HF and the bias electric power may be supplied. As shown in a solid line in FIG. 5, a continuous wave of bias electric power may be applied to the bottom electrode 18 in Step STP. The level of the radio-frequency power HF may be adjusted to 2 kW or more and 10 kW or less. If the radio-frequency power LF is used as the bias electric power, the level of the radio-frequency power LF may be adjusted to 2 kW or more. The level of the radio-frequency power LF may be adjusted to 10 kW or more.

In Step STP, the controller 80 controls the gas supply unit to supply the process gas into the chamber 10. The controller 80 also controls the evacuation system 50 such that the gas pressure in the chamber 10 is regulated within a predetermined pressure. In addition, the controller 80 controls the radio-frequency power source 62 and the bias power source 64 to supply the radio-frequency power HF, radio-frequency power LF, or the radio-frequency power HF and the bias electric power.

In Step ST2, the controller 80 controls the gas supply unit to supply the process gas into the chamber 10. The controller 80 also controls the evacuation system 50 to keep the gas pressure in the chamber 10 at a predetermined value. In addition, the controller 80 controls the radio-frequency power source 62 and the bias power source 64 to supply the radio-frequency power HF, radio-frequency power LF, or the radio-frequency power HF and the bias electric power.

In an embodiment of the method MT, the substrate W may be kept at a temperature of 0° C. or less at the start of Step ST2 (or Step STP). At such a temperature, the etching rate of the silicon-containing film SF on the substrate W increases in Step ST2. The controller 80 may control a chiller to adjust the temperature of the substrate W at the start of Step ST2. In Step ST2 (or Step STP), the temperature of the substrate W may be 200° C. or less. A temperature of 200° C. or less of the substrate W in Step ST2 (or Step STP) ensures supply of an etchant, i.e., phosphorus chemical species into the bottom of the recesses formed in the silicon-containing film SF.

At lower temperature (below 0 degree C., for example), side etch amount decreases according to Arrhenius rate law, which dictates that a rate of reaction increases with temperature. At lower temperatures, the volatility (a measure of a material's tendency to vaporize) of the protective layer (P—O) decreases. As discussed above, for low volatility (chemically strong), the effectiveness of the protective layer to protect against the sidewall from being laterally etched increases at lower temperature. Moreover, for high aspect etching, ion energy tends to be higher, and so the present inventor recognized the benefit for an etching temperature that should be lower to enhance the effectiveness of the protective layer. Therefore, in the context of this disclosure, a protective layer with lower volatility (achieved through controlling a temperature of the substrate W to remain low) is more desirable because it helps to suppress sidewall etching (bowing).

In one embodiment, the method MT may further involve Step STT. Step STT may be executed prior to Step ST2 (or Step STP). The temperature of the substrate W is set to 0° C. or less in Step STT. The temperature of the substrate W at the start of Step ST2 is set in Step STT. The controller 80 may control the chiller to set the temperature of the substrate W in Step STT.

In Step ST2, the silicon-containing film SF is etched by halogen chemical species in the plasma generated from the process gas. In one embodiment, the unmasked portion (portion exposed to plasma) of the silicon-containing film SF is etched as shown in FIG. 4(a).

If the process gas contains a compound functioning as a phosphorus component and a halogen component, such as PF3, the halogen chemical species derived from the compound contributes to etching of the silicon-containing film SF. The compound containing phosphorus and halogen, such as PF3, can accordingly enhance the etching rate of the silicon-containing film SF in Step ST2.

Figure 4A:
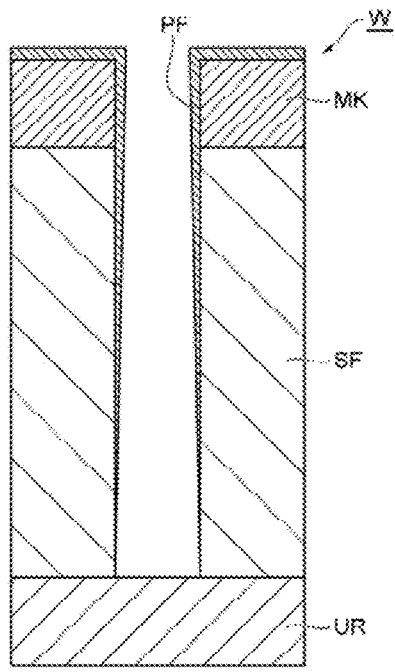
FIG. 4(a) is a partially enlarged cross-sectional view of an exemplary substrate to which the method in FIG. 1 is applied.
Figure 5:
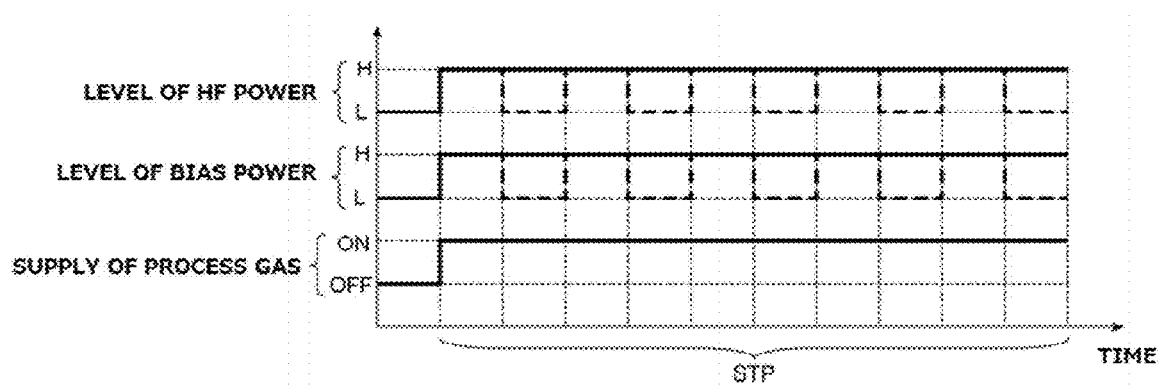
FIG. 5 is an exemplary timing chart of a method according to an exemplary embodiment.

In Step ST3, a protective film PF is formed on the side wall of the recess formed by etching in Step ST2 in the silicon-containing film SF (refer to FIG. 4(a)). The protective film PF is formed from the chemical species generated from the process gas in the chamber 10 in Step STP. Step ST3 and Step ST2 may be carried out at the same time. Referring to FIG. 4(a), the protective film PF according to one embodiment is formed such that its thickness decreases toward the depth of the recess formed in the silicon-containing film SF.

The protective film PF contains silicon and phosphorus contained in the process gas used in Step STP. In one embodiment, the protective film PF may further contain carbon and/or hydrogen contained in the process gas. In one embodiment, the protective film PF may further contain oxygen contained in the process gas or the silicon-containing film SF. In one embodiment, the protective film PF may contain bonds between phosphorus and oxygen.

Figure 6A:
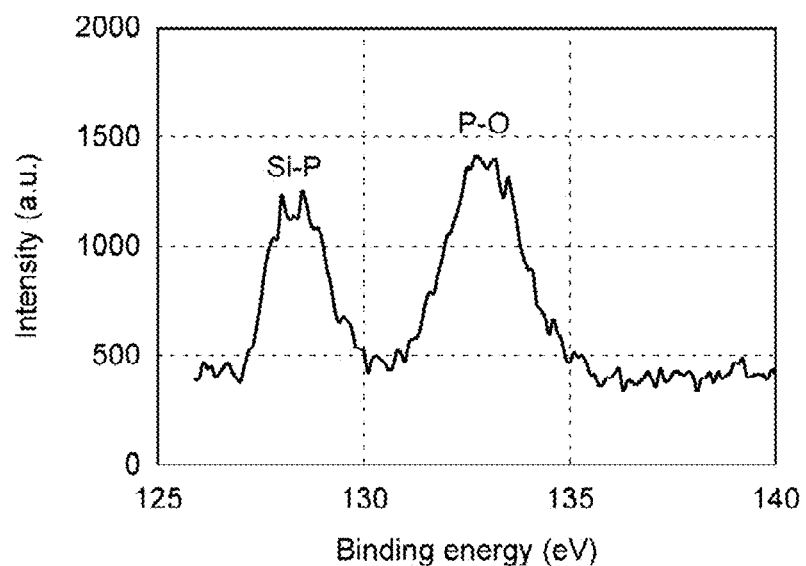
FIGS. 6(a) and 6(b) illustrate results of X-ray photoelectron spectroscopy (XPS) analysis of a protective film, PF, formed as an experimental example that involves etching of a silicon oxide film and a silicon nitride film, respectively, in the Step STP (FIG. 5).
Figure 6B:
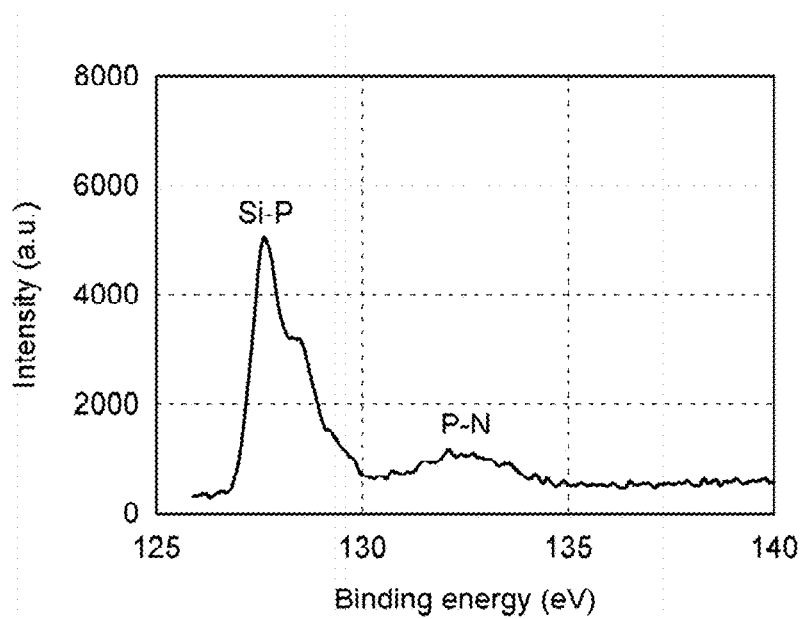

FIGS. 6(a) and 6(b) illustrate the results of XPS analysis of protective films PF formed in an experimental example that involves etching of a silicon oxide film and a silicon nitride film, respectively, in Step STP. FIGS. 6(a) and 6(b) illustrate P2p spectra. The conditions of the experimental example in Step STP are as follows:

<Conditions in Step STP>
Gas pressure in chamber 10: 100 mTorr (13.33 Pa)
Process gas: 50 sccm of $PF_3$ gas and 150 sccm of Ar gas
Radio-frequency power HF (continuous wave): 40 MHz, 4500 W
Radio-frequency power LF (continuous wave): 400 kHz, 7000 W
Substrate temperature (temperature of substrate support before etching): −70° C.
Execution time in Step STP: 30 seconds According to the experimental results of the etching of the silicon oxide film in Step STP, the results of the XPS analysis of the protective film PF show a peak assigned to a Si—O bond and a peak assigned to a P—O bond as illustrated in FIG. 6(a). According to the experimental results of the etching of the silicon nitride film in Step STP, the results of the XPS analysis of the protective film PF show a peak assigned to a Si—P bond and a peak assigned to a P—N bond as illustrated in FIG. 6(b).

Figure 4B:
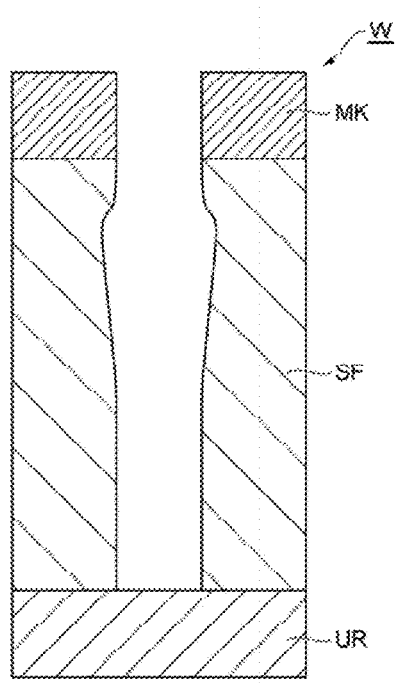
FIG. 4(b) is a partially enlarged cross-sectional view of an exemplary substrate that is etched by plasma generated from a phosphorus-free process gas.

If the process gas does not contain phosphorus, the silicon-containing film SF is etched also in the lateral direction as shown in FIG. 4(b). As a result, the width of the recess formed in the silicon-containing film SF increases partly. For example, the width of the recess formed in the silicon-containing film SF increases partly in the vicinity of the mask MK.

In the method MT, the protective film PF is formed on the side wall of the recess formed in the silicon-containing film SF during the etching. The protective film PF protects the side wall and allows the silicon-containing film SF to be etched at the same time. Lateral etching is accordingly reduced during the plasma etching of the silicon-containing film SF in the method MT.

In one embodiment, one or more periods of Steps ST2 and ST3 may be executed while Step STP is being continued, in detail, while plasma is generated from the process gas in Step STP. Step STP may involve at least two periods.

In one embodiment, the pulsed bias electric power may be applied from the bias power source 64 to the bottom electrode 18 in Step STP, as depicted with broken lines in FIG. 5. In detail, the pulsed bias electric power may be applied from the bias power source 64 to the bottom electrode 18, in the presence of plasma generated from the process gas in the chamber 10. In this embodiment, the silicon-containing film SF is etched mainly within the term H in the period of the pulsed bias electric power in Step ST2. The protective film PF is formed mainly within the term L in the period of the pulsed bias electric power in Step ST3.

If the bias electric power is radio-frequency power LF, the radio-frequency power LF may be adjusted to 2 kW or more during the term H of the period of pulsed bias electric power. Alternatively, the radio-frequency power LF may be adjusted to 10 kW or more during the term H of the period of pulsed bias electric power.

In one embodiment, the pulsed waves of the radio-frequency power HF may be applied in Step STP, as depicted with broken lines in FIG. 5. The radio-frequency power HF may be adjusted to 1 kW or more and 10 kW or less within the term H in the period of the pulsed radio-frequency power HF. With reference to FIG. 5, the period of the pulsed waves of the radio-frequency power HF may be in synchronization with the period of the pulsed bias electric power. With reference to FIG. 5, the term H in the period of the pulsed radio-frequency power HF may be in synchronization with the term H in the period of the pulsed bias electric power. Alternatively, the term H in the period of the pulsed radio-frequency power HF need not be in synchronization with the term H in the period of the pulsed bias electric power. The term H of the period of the pulsed radio-frequency power HF may be the same as or different from the term H of the period of the pulsed bias electric power.

Figure 7:
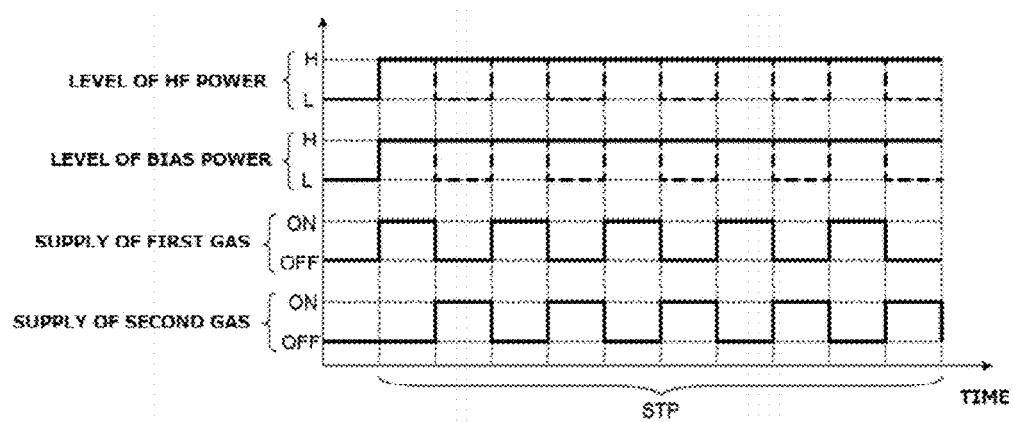
FIG. 7 is another exemplary timing chart of a method performed according to an exemplary embodiment.

FIG. 7 is an exemplary timing chart in the method according to an exemplary embodiment where the horizontal axis indicates time while the vertical axis indicates the level of the radio-frequency power HF, the level of the bias electric power, supply of a first gas, and supply of a second gas. The level "L" in the radio-frequency power HF indicates that no radio-frequency power HF is supplied or the level of the radio-frequency power HF is lower than the level "H". The level "L" in the bias electric power indicates that no bias electric power is supplied to the bottom electrode 18 or the level of the bias electric power is lower than the level "H". The symbol "ON" in the supply of the first gas indicates that the first gas is being supplied into the chamber 10 whereas the symbol "OFF" indicates that the first gas is not being supplied into the chamber 10. The symbol "ON" in the supply of the second gas indicates that the second gas is being supplied into the chamber 10 whereas the symbol "OFF" indicates that the second gas is not being supplied into the chamber 10.

With reference to FIG. 7, the first gas and the second gas may be alternately supplied to the chamber 10 in Step STP. The etching of silicon-containing film SF in Step ST2 is performed, mainly, during supply of the first gas to the chamber 10. The forming of the protective film PF in Step ST3 is performed, mainly, during supply of the second gas to the chamber 10.

Continuous radio-frequency power HF may be applied in Step STP, as depicted with a solid line in FIG. 7. Alternatively, pulsed radio-frequency power HF may be applied in Step STP, like the pulsed radio-frequency power HF shown in FIG. 5. Pulsed radio-frequency power HF is depicted with broken lines in FIG. 7. The term H within the period of the pulsed radio-frequency power HF is in synchronization with or partially overlap with the term during which the first gas is supplied to the chamber 10. In contrast, the term L within the period of the pulsed radio-frequency power HF is in synchronization with or partially overlap with the term during which the second gas is supplied to the chamber 10.

Alternatively, continuous bias electric power may be applied to the bottom electrode 18 in Step STP as shown by a solid line in FIG. 7. Alternatively, pulsed bias electric power may be applied to the bottom electrode 18 in Step STP, like the pulsed bias electric power shown in FIG. 5. The pulsed bias electric power is depicted with broken lines in FIG. 7. The term H within the period of the pulsed bias-frequency power is in synchronization with or partially overlap with the term during which the first gas is supplied to the chamber 10. The term L within the period of the pulsed bias-frequency power is in synchronization with or partially overlap with the term during which the second gas is supplied to the chamber 10.

An advantage offered by pulsing the electric power for biasing, during etching is that a bifurcation of etching and deposition phases is created, rather than mainly deposition or mainly etching. Moreover, when bias electric power is supplied to a bottom electrode, etching mainly occurs. On the other hand, when bias electric power is not supplied to the bottom electrode, deposition mainly occurs. By applying pulsed bias electric power, separate, but interleaved, etch phases and deposition phases are realized. For the etch phase, the etching occurs after the protective film is formed, and then the sidewall of the recess is protected from side-etch. Thus, successive phases of forming a protection film (deposition) followed by etching results in controlled etching that suppresses side-wall bowing while a depth of the recess continues to deepen. In addition, changing the duty cycle of the pulse ((Bias-on time/(Bias-on time+Bias-off time)) provides a mechanism for controlling a balance between etch/deposition phases. A longer Bias-off time helps form a thicker protective layer, which leads to more protection from sidewall etch. Longer Bias-on time increase etch rate, thus controlling the time required to reach a predetermined etch depth.

Experiments for evaluation of the method MT will now be explained. Multiple sample substrates are prepared for the experiments. Each sample substrate had a silicon oxide film and a mask formed on the silicon oxide film. The mask was made of an amorphous carbon film. In the experiments, Step STP in the method MT was applied to each sample substrate.

The process gases used for these sample substrates contained PF3 gas at different flow rates. Other conditions in Step STP are shown below, where the flow rates of the PF3 gas were 0 sccm, 15 sccm, 30 sccm, 50 sccm, and 100 sccm, respectively, in other words, the ratios of the flow rate of the second gas to the flow rate of the first gas were 0, 0.075, 0.15, 0.25, and 0.5, respectively.

<Conditions in Step STP>

Gas pressure in chamber 10: 25 mTorr (3.3 Pa)

Process gas: 50 sccm of $CH_4$ gas, 100 sccm of $CF_4$ gas, and 50 sccm of $O_2$ gas Radio-frequency power HF (continuous wave): 40 MHz, 4500 W Radio-frequency power LF (continuous wave): 400 kHz, 7000 W Sample substrate temperature (temperature of substrate support before etching): −30° C.

Execution time in Step STP: 600 seconds

Figure 8:
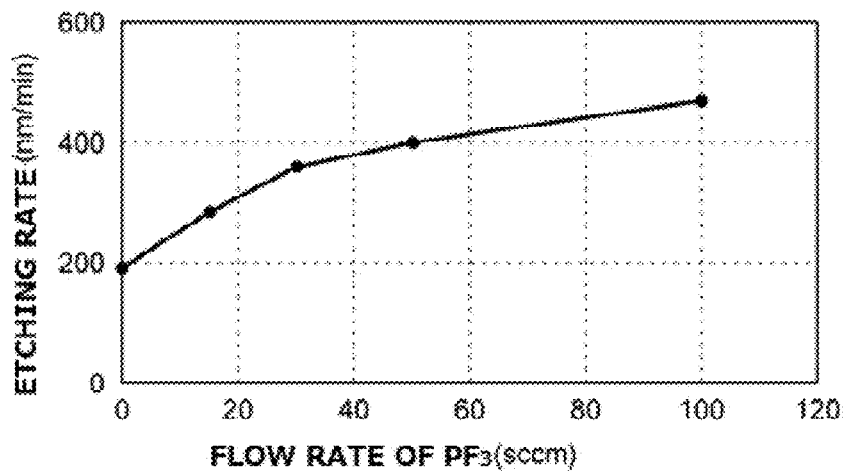
FIG. 8 is a graph illustrating an empirically observed relation between the flow rate of PF3 gas in the process gas and the etching rate of the silicon oxide film.
Figure 9:
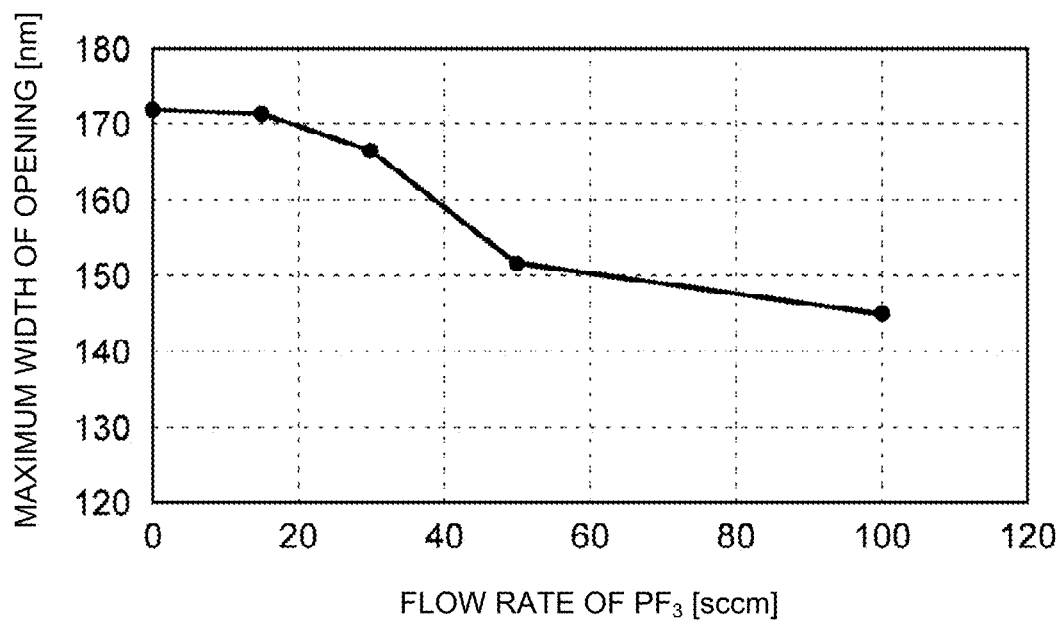
FIG. 9 is a graph illustrating an empirically observed relation between the flow rate of PF3 gas in the process gas and a maximum width of a recess formed in the silicon oxide film.
Figure 10:
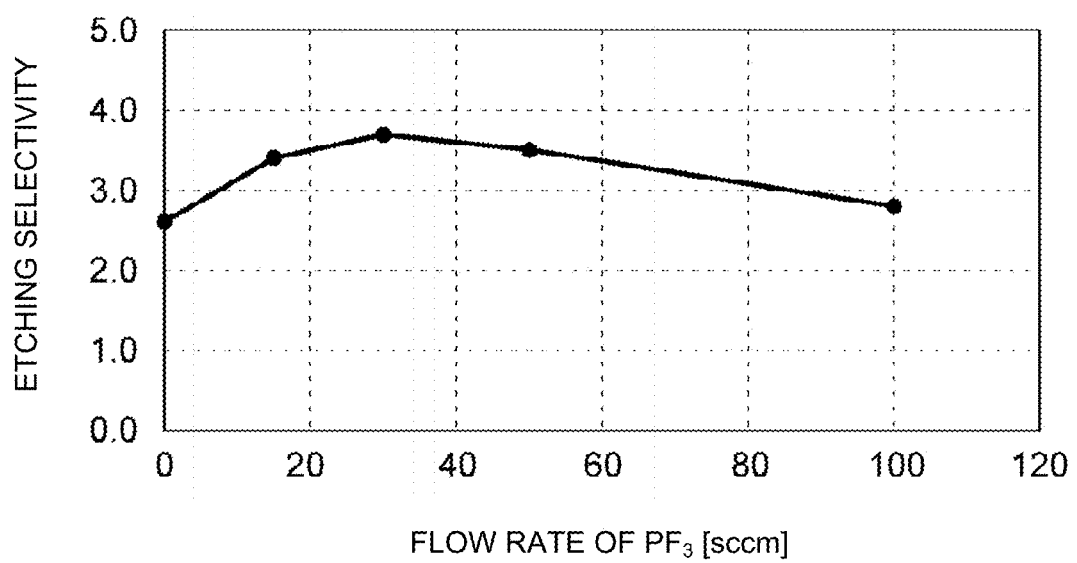
FIG. 10 is a graph illustrating an empirically observed relation between a flow rate of PF3 in the process gas and the etching selectivity.

Throughout the experiments, the maximum width of the recess formed in the silicon oxide film, the etching rate of the silicon oxide film, and the etching selectivity of each sample substrate were determined. The etching selectivity is a value of the etching rate of the silicon oxide film divided by the etching rate of the mask. The relation between the flow rate of the PF3 gas in the process gas used in Step STP and the etching rate of the silicon oxide film was then determined. The relation between the flow rate of the PF3 gas in the process gas used in Step STP and the maximum width of the recess in the silicon oxide film was also determined. In addition, the relation between the flow rate of the PF3 gas in the process gas used in Step STP and the etching selectivity was determined. FIG. 8 shows the relation between the flow rate of the PF3 gas of the process gas and the etching rate of the silicon oxide film. FIG. 9 shows the relation between the flow rate of the PF3 gas of the process gas and the maximum width of the recess formed in the silicon oxide film. FIG. 10 shows the relation between the flow rate of the PF3 gas of the process gas and the etching selectivity.

FIGS. 8 and 10 demonstrate that the etching rate and the etching selectivity of the silicon oxide film increase in the case that the process gas contains a phosphorus component, in other words, the ratio of the flow rate is greater than 0. FIG. 10 also demonstrates that the etching selectivity is considerably high in the case that the flow rate of PF3 gas in the process gas is in the range from 15 sccm to 50 sccm or 60 sccm, in other words, in the case that the ratio of the flow rate is in the range from 0.075 to 0.25 or 0.3. FIG. 8 demonstrates that the etching rate at a flow rate of the PF3 gas in the process gas of 20 sccm or more or at a ratio of the flow rate of 0.1 or more is about 1.5 times the etching in the case that no PF3 is added.

FIG. 9 demonstrates that a process gas containing a phosphorus component causes decrease in the maximum width of the recess formed in the silicon oxide film, in other words, reduces partial expansion of the recess in the silicon oxide film. At a flow rate of the PF3 gas in the process gas of 50 sccm or more, partial expansion of the recess in the silicon oxide film can be reduced. Moreover, in FIG. 9, The x axis exhibits a flow rate of PF3, and the y axis exhibits a maximum width of an opening (nm) of the etching recess. An amount of etchant F increases as PF3 flow increases, and an increase in etchant leads to an etching rate increase (see FIG. 8). As PF3 increases, vertical etching rate increases. However, as PF3 flow rate increases, a maximum width of an opening of the recess remains almost constant (slightly smaller) to a flow rate of 15 sccm (7.5%). For a flow rate beyond 15 sccm (7.5%), the maximum width of the opening of the recess decreases. Accordingly, use of a P containing gas during etch efficiently suppresses side etch (bowing).

With regard to a P—O bond containing protective film, a protective layer with a P—O bond has a low volatility (i.e., is chemically strong). As recognized by the present inventor, the existence of the protective layer with a P—O bond is effective at protecting the side wall of the recess in a Si-containing layer from being removed by ion attack with relatively low energy. On the other hand, ions incident on the bottom of the recess have a higher energy and thus remove (etch) the bottom of the recess even when the protective layer is formed on the bottom of the recess. Thus, the P—O bond protective layer preferentially protects against undesired sidewall etch because the P—O bond protective layer is sufficiently chemically strong enough to avoid being removed by lower energy ions that impart a glancing blow on the sidewall, while higher ions that bombard the bottom of the recess via a direct impact are sufficiently high in energy to etch through the P—O bond protective layer at the bottom of the recess. In turn, this allows for etching higher aspect ratio recesses with sidewall-bowing suppression.

Regardless of the various exemplary embodiments that have been described, any addition, elimination, replacement, and modification on these embodiments may be allowable. The components in different embodiments can be combined to form other embodiments.

For example, the plasma treatment system 1 used in the method MT may be replaced with a capacitively coupled plasma treatment system, an inductively coupled plasma treatment system, an electron cyclotron resonance (ECR) plasma treatment system, or a plasma treatment system that generates plasma by using surface wave, for example, microwaves.

The plasma treatment system may also include another bias power source that can apply pulsed DC waves with negative polarity to the bottom electrode, in addition to the bias power source 64 that apply the radio-frequency power LF to the bottom electrode 18.

Figure 11:
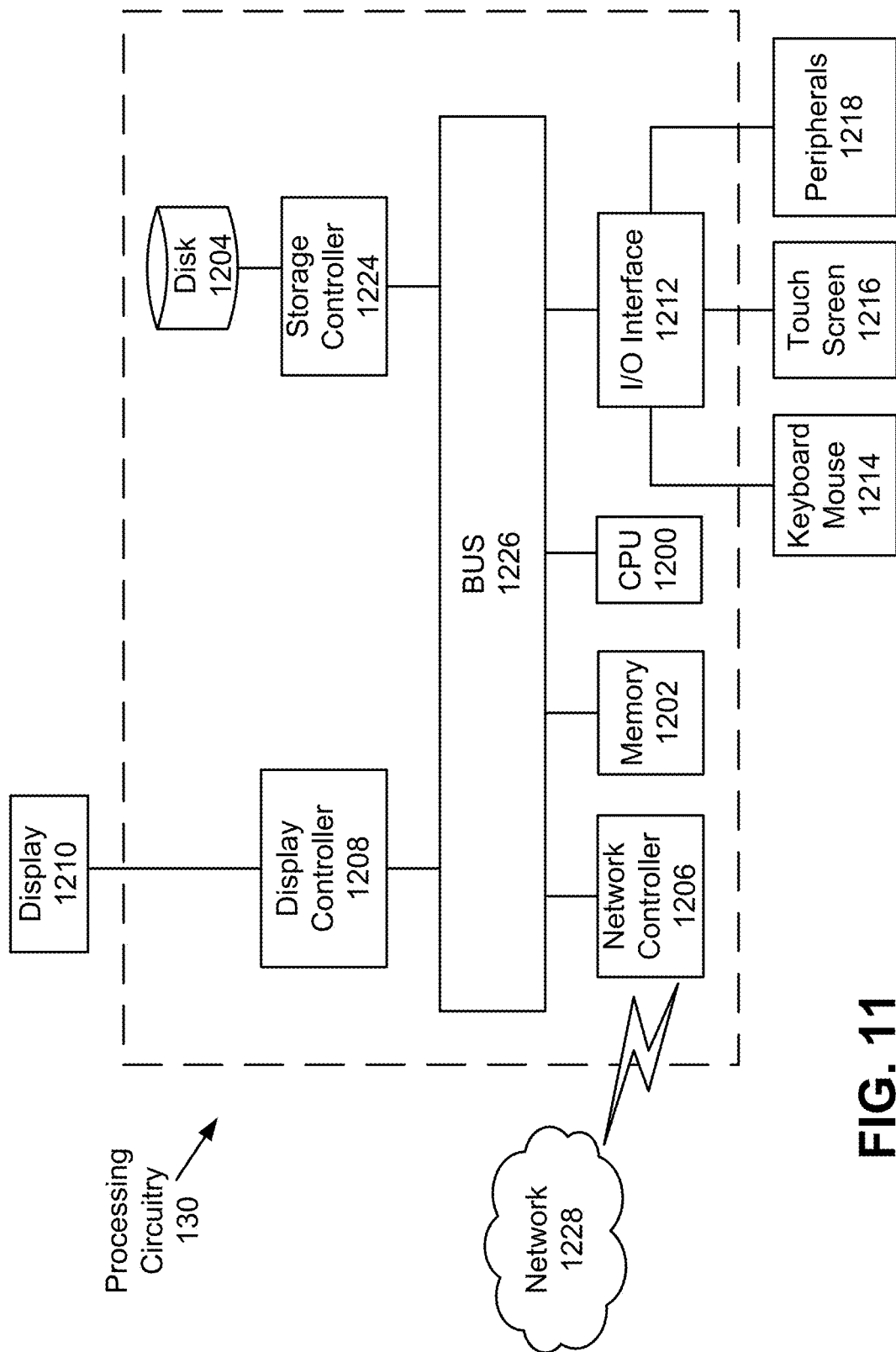
FIG. 11 is a diagram of controller circuitry used to control process operations, such as the plasma treatment system of FIG. 3 and other processes and equipment described herein.

FIG. 11 is a block diagram of processing circuitry for performing computer-based operations described herein. FIG. 11 illustrates control circuitry 130 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 11, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 11. A processing circuit also includes devices such as an application specific integrated circuit (ASIC) and conventional circuit components arranged to perform the recited functions.

In FIG. 11, the processing circuitry 130 includes a CPU 1200 which performs the processes described above. The processing circuitry 130 may be a general-purpose computer or a particular, special-purpose machine.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 11 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The disclosed embodiments include the following aspects (1)-(99)

(1) A method of etching includes
- A) providing a substrate in a chamber of a plasma treatment system, the substrate including a silicon-containing film; and
- B) etching the silicon-containing film with a plasma generated from a process gas supplied to the chamber, the process gas containing a halogen component and a phosphorus component, wherein
  - the etching includes providing a first phosphorus-free gas at a first flow rate and a second phosphorus-containing gas at a second flow rate, and a ratio of the second flow rate to the first flow rate being above 0 and 0.5 or less.

(2) The method of (1), wherein the ratio is 0.1 or more and 0.25 or less.

(3) The method of (2), wherein the phosphorus component comprises at least one phosphorus compound selected from a group consisting of PF3, PCl3, PF5, PCl5, POCl3, PH3, PBr3, and PBr5.

(4). The method of (1), wherein the process gas further comprises a carbon component and a hydrogen component.

(5). The method of (4), wherein the hydrogen component in the process gas comprises at least one hydrogen molecule selected from a group consisting of H2, HF, CxHy, CHxFy, and NH3, where x and y are each natural numbers.

(6). The method of (1), wherein the halogen component is a fluorine gas.

(7). The method of (1), wherein the process gas further comprises a fluorocarbon as a compound containing the halogen component.

(8). The method of (1), wherein the process gas further comprises oxygen.

(9). The method of (1), wherein the process gas is free of oxygen.

(10). The method of (1), wherein the etching comprises forming a protective film on a side wall of a recess formed as a result of the etching.

(11). The method of (10), wherein the protective film contains phosphorus-oxygen bonds.

(12). The method of (11), wherein the protective film further contains phosphorus-silicon bonds.

(13). The method of (1), further comprising setting a temperature of the substrate to 0° C. or less before beginning the etching.

(14). The method of (1), wherein the etching includes applying a radio-frequency bias power of 2 kW or more to a lower electrode in a substrate support.

(15). The method of (14), further comprising pulsing a level of the radio-frequency bias power that is supplied to the lower electrode.

(16). The method of (1), wherein the silicon-containing film comprises at least two different silicon-containing layers.

(17). The method of (16), wherein the at least two silicon-containing layers comprise a silicon oxide sublayer and a silicon nitride sublayer.

(18). The method of (16), wherein the at least two silicon-containing layers comprise silicon oxide sublayers and silicon nitride sublayers that are alternately disposed.

(19). The method of (16), wherein the at least two silicon-containing layers comprise a silicon oxide sublayer and an elemental silicon sublayer.

(20). The method of (16), wherein the at least two silicon-containing layers comprise silicon oxide sublayers and polysilicon sublayers that are alternately stacked.

(21). The method of (1), wherein the substrate further comprises a mask on the silicon-containing film.

(22). A method of etching includes
A) providing a substrate in a chamber of a plasma treatment system, the substrate including a silicon-containing film;
B) etching the silicon-containing film with a plasma generated from a process gas supplied to the chamber, the process gas containing a halogen component and a phosphorus component to form a recess in the silicon-containing film; and
C) forming a protective film on a side wall of the recess, the protective film containing phosphorus-oxygen bonds derived from the phosphorus component contained in the process gas.

(23). The method of (22), wherein the etching and the forming are carried out at a same time.

(24). The method of (22), wherein the etching and the forming are carried out independent of one another.

(25). The method of (22), wherein the forming includes forming the protective film to have a thickness that decreases with a depth of the recess.

(26). The method of (22), further comprising
while performing the etching and forming, applying pulsed bias electric power to a bottom electrode in a substrate support that supports the substrate, wherein the pulsed bias electric power is a radio-frequency bias power or a pulsed DC voltage with negative polarity.

(27). The method of (26), wherein the radio-frequency bias power supplied to the bottom electrode is 2 kW or more.

(28). The method of (22), further comprising
generating the plasma with pulsed radio-frequency power.

(29). The method of (22), wherein the process gas comprises a first phosphorus-free gas and a second phosphorus-containing gas.

(30). The method of (29), further comprising:
alternately applying to the chamber the first phosphorus-free gas and the second phosphorus-containing gas.

(31). The method of (30), wherein a ratio of a flow rate of the second phosphorus-containing gas to a flow rate of the first phosphorus-free gas is above 0 and 0.5 or less.

(32). The method of (31), wherein the ratio is in an inclusive range from 0.1 through 0.25.

(33). The method of (22), wherein the forming includes forming the protective film to include phosphorous-silicon bonds.

(34). The method of (22), wherein the phosphorus component comprises PF3.

(35). The method of (22), wherein the phosphorus component comprises at least one phosphorus compound selected from a group consisting of PF3, PCl3, PF5, PCl5, POCl3, PH3, PBr3, and PBr5.

(36). The method of (22), wherein the process gas further comprises a carbon component and a hydrogen component.

(37). The method of (36), wherein the hydrogen component comprises at least one hydrogen-containing molecule selected from a group consisting of H2, HF, CxHy, CHxFy, and NH3, where x and y are each natural numbers.

(38). The method of (22), wherein the halogen component is a fluorine gas.

(39). The method of (22), wherein the halogen component comprises a fluorocarbon.

(40). The method of (22), wherein the forming comprises supplying oxygen for the phosphorus-oxygen bonds from the silicon-containing film.

(41). The method of (22), wherein the process gas is free of oxygen.

(42). The method of (22), wherein the process gas further comprises oxygen.

(43). The method of (22), further comprising setting a temperature of the substrate to 0° C. or less before beginning the etching.

(44). The method of (22), wherein the silicon-containing film comprises at least two different silicon-containing sublayers.

(45). The method of (44), wherein the at least two silicon-containing layers comprise a silicon oxide sublayer and a silicon nitride sublayer.

(46). The method of (44), wherein the at least two silicon-containing layers comprise silicon oxide layers and silicon nitride layers that are alternately disposed.

(47). The method of (44), wherein the at least two silicon-containing layers comprise a silicon oxide sublayer and an elemental silicon sublayer.

(48). The method of (44), wherein the at least two silicon-containing layers comprise silicon oxide layers and polysilicon layers that are alternately stacked.

(49). The method of (22), wherein the substrate further comprises a mask on the silicon-containing film.

(50). A method of etching comprising:
A) supporting a substrate on a substrate support in a chamber of a plasma treatment system, the substrate including a silicon-containing film, and the substrate support having a bottom electrode;
B) generating plasma in the chamber from a process gas containing a halogen component and a phosphorus component; and
C) applying bias electric power to the bottom electrode while in the presence of the plasma in the chamber,
wherein the bias electric power is a pulsed radio-frequency bias power or a pulsed DC voltage with negative polarity.

(51). The method of (50), wherein the applying comprises alternately switching between continuation and cessation of the bias electric power to the bottom electrode.

(52). The method of (50), wherein applying includes varying a level of the bias electric power.

(53). The method of (50), wherein
the bias electric power is pulsed bias electric power and is periodically applied to the bottom electrode, and
each period of the pulsed bias electric power comprises a first term and a second term, a level of the pulsed bias electric power at the first term being higher than a level of the pulsed bias electric power at the second term, and
a duty ratio of the first term in the period is in an inclusive range from 1% through 80%.

(54). The method of (53), wherein a frequency that defines the period is in an inclusive range from 5 Hz through 100 kHz.

(55). The method of (53), wherein a level of the pulsed bias electric power during the first term is 2 kW or more.

(56). The method of (50), wherein the process gas comprises a first phosphorus-free gas and a second phosphorus-containing gas.

(57). The method of (50), further comprising:
alternately applying to the chamber the first phosphorus-free gas and the second phosphorus-containing gas.

(58). The method of (57), wherein a term during which the first phosphorus-free gas is supplied at least partially overlaps with a term during which the bias electric power is applied to the bottom electrode.

(59). The method of (57), wherein a ratio of a flow rate of the second phosphorus-containing gas to a flow rate of the first phosphorus-free gas is above 0 and 0.5 or less.

(60). The method of (59), wherein the ratio is in an inclusive range from 0.1 through 0.25.

(61). The method of (50), wherein the generating comprises:
etching the silicon-containing film to form a recess; and
forming a protective film on the side wall of the recess, wherein
the etching and forming are carried out independently from each other.

(62). The method of (61), wherein the protective film contains phosphorus-oxygen bonds.

(63). The method of (62), wherein the protective film further contains phosphorus-silicon bonds.

(64). The method of (50), wherein the phosphorus component in the process gas comprises PF3.

(65). The method of (50), wherein the phosphorus component in the process gas comprises at least one phosphorus compound selected from a group consisting of PF3, PCl3, PF5, PCl5, POCl3, PH3, PBr3, and PBr5.

(66). The method of (50), wherein the process gas further comprises a carbon component and a hydrogen component.

(67). The method of (66), wherein the hydrogen component comprises at least one hydrogen-containing molecule selected from a group consisting of H2, HF, CxHy, CHxFy, and NH3, where x and y are each natural numbers.

(68). The method of (50), wherein the halogen component is a fluorine gas.

(69). The method of (50), wherein the process gas comprises a fluorocarbon.

(70). The method of (50), wherein the process gas further comprises oxygen.

(71). The method of (50), wherein the process gas is free of oxygen.

(72). The method of (50), further comprising setting a temperature of the substrate to 0° C. or less before beginning the etching.

(73). The method of (50), wherein the silicon-containing film comprises at least two different silicon-containing layers.

(74). The method of (73), wherein the at least two silicon-containing layers comprise a silicon oxide sublayer and a silicon nitride sublayer.

(75). The method of (73), wherein the at least two silicon-containing layers comprise silicon oxide sublayers and silicon nitride sublayers that are alternately disposed.

(76). The method of (73), wherein the at least two silicon-containing layers comprise a silicon oxide sublayer and an elemental silicon sublayer.

(77). The method of (73), wherein the at least two silicon-containing layers comprise silicon oxide sublayers and polysilicon sublayers that are alternately stacked.

(78). The method of (50), wherein the substrate further comprises a mask on the silicon-containing film.

(79). A method of etching comprising:
A) providing a substrate in a chamber of a plasma treatment system, the substrate including a silicon-containing film;
B) after the providing, adjusting a temperature of the substrate to 0° C. or less;
C) etching the silicon-containing films with a plasma generated from a process gas containing phosphorus in the chamber to create a recess in the silicon containing films; and
D) forming a protective film on a side wall of the recess.

(80). The method of (79), wherein the silicon-containing films are silicon oxide films.

(81). The method of (79), wherein the process gas comprises a first phosphorus-free gas and a second PF3-containing gas.

(82). The method of (81), wherein a ratio of a flow rate of the second PF3-containing gas to a flow rate of the first phosphorus-free gas is above 0 and 0.5 or less.

(83). The method of (82), wherein the ratio is in an inclusive range from 0.1 through 0.25.

(84). The method of (79), wherein the process gas further comprises a fluorocarbon.

(85). The method of (79), wherein the process gas further comprises a carbon component and a hydrogen component.
(86). The method of (85), wherein the hydrogen component comprises at least one hydrogen-containing molecule selected from a group consisting of H2, HF, CxHy, CHxFy, and NH3, where x and y are each natural numbers.
(87). The method of (79), wherein the process gas further comprises oxygen.
(88). The method of (79), wherein the process gas is free of oxygen.
(89). The method of (79), wherein the etching and forming are carried out independently from each other.
(90). The method of (79), wherein the protective film contains phosphorus-oxygen bonds.
(91). The method of (90), wherein the protective film further contains phosphorus-silicon bonds.
(92). The method of (79), wherein etching includes applying a radio-frequency bias electric power of 2 kW or more to a bottom electrode in a substrate support.
(93). The method of (79), wherein the etching includes applying a pulsed DC voltage with negative polarity to the bottom electrode in s substrate support.
(94). The method of (79), wherein the silicon-containing film comprises at least two different silicon-containing layers.
(95). The method of (94), wherein the at least two silicon-containing layers comprise a silicon oxide sublayer and a silicon nitride sublayer.
(96). The method of (94), wherein the at least two silicon-containing layers comprise silicon oxide sublayers and silicon nitride sublayers that are alternately disposed.
(97). The method of (94), wherein the at least two silicon-containing layers comprise a silicon oxide sublayer and an elemental silicon sublayer.
(98). The method of (94), wherein the at least two silicon-containing layers comprise silicon oxide sublayers and polysilicon sublayers that are alternately stacked.
(99). The method of (79), wherein the substrate further comprises a mask on the silicon-containing film.

It should be understood that the embodiments described above are provided for mere illustrative purposes and can be modified within the scope of the invention. The embodiments disclosed herein should not be construed to limit of the scope of the disclosure and the scope of the disclosure should be determined based on the description of the attached claims.

The invention claimed is:
1. A method of etching comprising:
A) supporting a substrate on a substrate support in a chamber of a plasma treatment system, the substrate including a silicon-containing film, and the substrate support having a bottom electrode;
B) generating plasma in the chamber from a process gas containing a halogen component and a phosphorus component;
C) applying bias electric power to the substrate support while in the presence of the plasma in the chamber, wherein
the bias electric power is a pulsed radio-frequency bias power or a pulsed DC voltage with negative polarity,
the bias electric power is pulsed bias electric power and is periodically applied to the substrate support,
each period of the pulsed bias electric power comprises a first term and a second term, a level of the pulsed bias electric power at the first term being higher than a level of the pulsed bias electric power at the second term, and
a duty ratio of the first term in the period is in an inclusive range from 1% through 80%.

2. The method of claim 1, wherein the phosphorus component comprises at least one phosphorus compound selected from the group consisting of PF3, PCl3, PF5, PCl5, POCl3, PH3, PBr3, and PBr5.

3. The method of claim 2, further comprising:
alternately applying to the chamber a first phosphorus-free gas and a second phosphorus-containing gas.

4. The method of claim 1, wherein the generating comprises:
etching the silicon-containing film to form a recess; and
forming a protective film on the side wall of the recess, wherein
the etching and forming are carried out independently from each other, and
the protective film contains phosphorus-oxygen bonds.

5. The method of claim 1, wherein:
the hydrogen component in the process gas comprises at least one selected from the group consisting of H2, HF, CxHy, CHxFy, and NH3, where x and y are each natural numbers.

6. The method of claim 5, wherein
the process gas further comprises a carbon component, the carbon component in the process gas comprises at least one gas selected from the group consisting of CF4, C3F8, C4F6 and C4F8.

7. The method of claim 1, further comprising etching the silicon-containing film and forming a protective film on a side wall of a recess formed as a result of the etching.

8. The method of claim 7, wherein the protective film contains phosphorus-oxygen bonds.

9. The method of claim 8, wherein the protective film further contains phosphorus-silicon bonds.

10. The method of claim 7, further comprising setting a temperature of the substrate to 0° C. or less before beginning the etching.

11. The method of claim 7, wherein the bias electric power being 2 kW or more.

12. A method of etching comprising:
A) supporting a substrate on a substrate support in a chamber of a plasma treatment system, the substrate including a silicon-containing film, and the substrate support having a bottom electrode;
B) generating plasma in the chamber from a process gas containing a halogen component and a phosphorus component;
C) applying bias electric power to the substrate support while in the presence of the plasma in the chamber, and
alternately applying to the chamber a first phosphorus-free gas and a second phosphorus-containing gas, wherein
the bias electric power is a pulsed radio-frequency bias power or a pulsed DC voltage with negative polarity, and
a term during which the first phosphorus-free gas is supplied at least partially overlaps with a term during which the bias electric power is applied to the substrate support.

13. The method of claim 12, further comprising:

etching the silicon-containing film; and forming a protective film on a side wall of the recess, the protective film containing phosphorus-oxygen bonds derived from the phosphorus component contained in the process gas, wherein the etching and the forming are carried out independent of one another.

14. The method of claim 12, wherein a ratio of a flow rate of the second phosphorus-containing gas to a flow rate of the first phosphorus-free gas is above 0 and 0.5 or less.

15. The method of claim 12, wherein the generating comprises:

etching the silicon-containing film to form a recess; and forming a protective film on the side wall of the recess, wherein the etching and forming are carried out independently from each other, and the protective film contains phosphorus-oxygen bonds.

16. The method of claim 12, further comprising:

etching the silicon-containing film; and forming a protective film on a side wall of the recess, the protective film containing phosphorus-oxygen bonds derived from the phosphorus component contained in the process gas, wherein the etching and the forming are carried out at a same time.

17. The method of claim 16, wherein the forming includes forming the protective film to have a thickness that decreases with a depth of the recess.

18. The method of claim 16, wherein the bias electric power applied to the substrate support is 2 kW or more.

19. The method of claim 16, wherein the forming includes forming the protective film to include phosphorous-silicon bonds.

20. The method of claim 16, wherein the process gas comprises a first phosphorus-free gas and a second phosphorus-containing gas.

21. The method of claim 20, further comprising:

alternately applying to the chamber the first phosphorus-free gas and the second phosphorus-containing gas.

22. The method of claim 21, wherein a ratio of a flow rate of the second phosphorus-containing gas to a flow rate of the first phosphorus-free gas is above 0 and 0.5 or less.

\* \* \* \* \*